United States Patent [19]
Tai et al.

[11] Patent Number: 6,028,341
[45] Date of Patent: Feb. 22, 2000

[54] LATCH UP PROTECTION AND YIELD IMPROVEMENT DEVICE FOR IC ARRAY

[75] Inventors: Yu-Chin Tai, Hsinchu; Ya-Nan Mou, Taipei, both of Taiwan

[73] Assignee: United Microelectronics Corp., Hsinchu, Taiwan

[21] Appl. No.: 09/036,817

[22] Filed: Mar. 9, 1998

[51] Int. Cl.$^7$ .......................... H01L 29/76; H01L 29/94; H01L 31/062; H01L 31/113; H01L 31/119

[52] U.S. Cl. ............................................. 257/372; 257/401

[58] Field of Search .................................. 257/372, 398, 257/399, 400, 401

[56] References Cited

U.S. PATENT DOCUMENTS

| | | | |
|---|---|---|---|
| 5,063,429 | 11/1991 | Crafts | 257/203 |
| 5,723,882 | 3/1998 | Okabe et al. | 257/139 |

*Primary Examiner*—Brian Dutton
*Attorney, Agent, or Firm*—Merchant & Gould, P.C.

[57] ABSTRACT

The integrated circuits array with latch up protection includes an active array and a guard array. The active array contains a plurality of integrated circuits devices having operational functions. The guard array abutting an outer peripheral portion of the active array contains a plurality of transistors for protecting the plurality of integrated circuits devices from latch up. In general, the active array can be functional circuits like a memory array or a read only memory (ROM) array. The plurality of transistors in the guard array can be formed simultaneously with transistors in the active array and have same structure with the transistors.

15 Claims, 3 Drawing Sheets

LATCH UP PROTECTION AND YIELD IMPROVEMENT DEVICE FOR IC ARRAY

FIELD OF THE INVENTION

The present invention relates to integrated circuits (IC) devices, and more specifically to a latch up protection and yield improvement device for IC array.

BACKGROUND OF THE INVENTION

The IC industry has developed for four decades from the birth of the first semiconductor device in 1960. With the progressing of the semiconductor manufacturing technology, the number of devices on a chip increases explosively. A semiconductor chip has in general millions of devices or more devices with present ULSI (ultra large scale integration) technology. For fabricating such a densely packed circuits, every device has to be manufactured with smaller size without damaging the operational characteristics. New challenges accompanying with smaller feature size like latch up problem and yield rate of fabrication must be considered at the same time.

With the present and future developments of semiconductor manufacturing into sub-micrometer and smaller feature size, the chip size is getting bigger and the size of the devices is getting smaller. The characteristics of active region and the operation of the device are easily influenced by neighboring devices under narrower device to device isolation. The problem is enhanced especially for devices located at the edge region of an operational array. Thus the yield of the fabricating process can be greatly reduced with lower uniformity at the array edge under the increased integrity of the integrated circuits. The latch up problem of the operational devices are also enhanced. For integrated circuits array like memory cell array or more specifically ROM (read only memory) array, the devices must be carefully protected from the latch up problem to ensure the functionality of the cell or the circuits.

In conventional integrated circuits array, the addition of a dummy cell array is presented to surround an active array of functional devices. As shown in FIG. 1, a schematic figure of an integrated circuits array 10 is illustrated. The active array 12 contains a plurality of functional devices for performing the operation of the circuits. A dummy cell array 14 with non-functional devices are formed around the active array 12. The low yield from the low uniformity problem especially at the edge of the active array 12 can be relieved by the dummy cell array 14.

For protecting active array 10 like memory array or ROM array from latch up problem, an additional guard ring 16 is employed. In general, the guard ring 16 is formed outside the dummy cell array 14 for latch up protection. The guard ring 16 in conventional devices contains a plurality of substrate or well contacts for forming a guard ring circulating the active array 12 with dummy cell array 14 in-between.

By applying the dummy cell array 14 and the guard ring 16 on the outer edge of the active array 12, the yield problem and the latch up problem can be reduced. However, all the devices in the dummy cell array 14 and the guard ring 16 are non-functional devices. A great number of non-functional devices are needed for each integrated circuits array 10 and thus the area left on a chip for functional devices in the active array 12 is significantly reduced. Thus the packing density of the IC chips is reduced and the cost for the circuits is hard to cut down.

SUMMARY OF THE INVENTION

A latch up protection and yield improvement device for the integrated circuits array is provided in the present invention. A guard array is provided to solve the non-uniformity problem of the devices at the edge region of the active array. The yield of the fabrication process can be raised. By connecting the transistors in the guard array, the active array like memory array or ROM array can be protected from latch up problem. The area used by the guard array of the present invention can be greatly reduced. Thus the yield and latch up protection can be enhanced at the same time with raised packing density of the integrated circuits.

The integrated circuits array with latch up protection includes an active array and a guard array. The active array contains a plurality of integrated circuits devices having operational functions. The guard array abutting an outer peripheral portion of the active array contains a plurality of transistors for protecting the plurality of integrated circuits devices from latch up.

In, general, the active array can be functional circuits like a memory array or a read only memory (ROM) array. The plurality of transistors in the guard array can be formed simultaneously with transistors in the active array and have same structure with the transistors.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention disclosed a latch up protection and yield improvement device for the integrated circuits array. A guard array is disclosed to solve the non-uniformity problem. The yield of the fabrication process can be raised. By the transistors in the guard array, the active array like memory array or ROM array can be protected from latch up problem. The area used by the guard array of the present invention can be greatly reduced. Thus the yield and latch up protection can be enhanced as well as the packing density of the integrated circuits.

Figure 1:
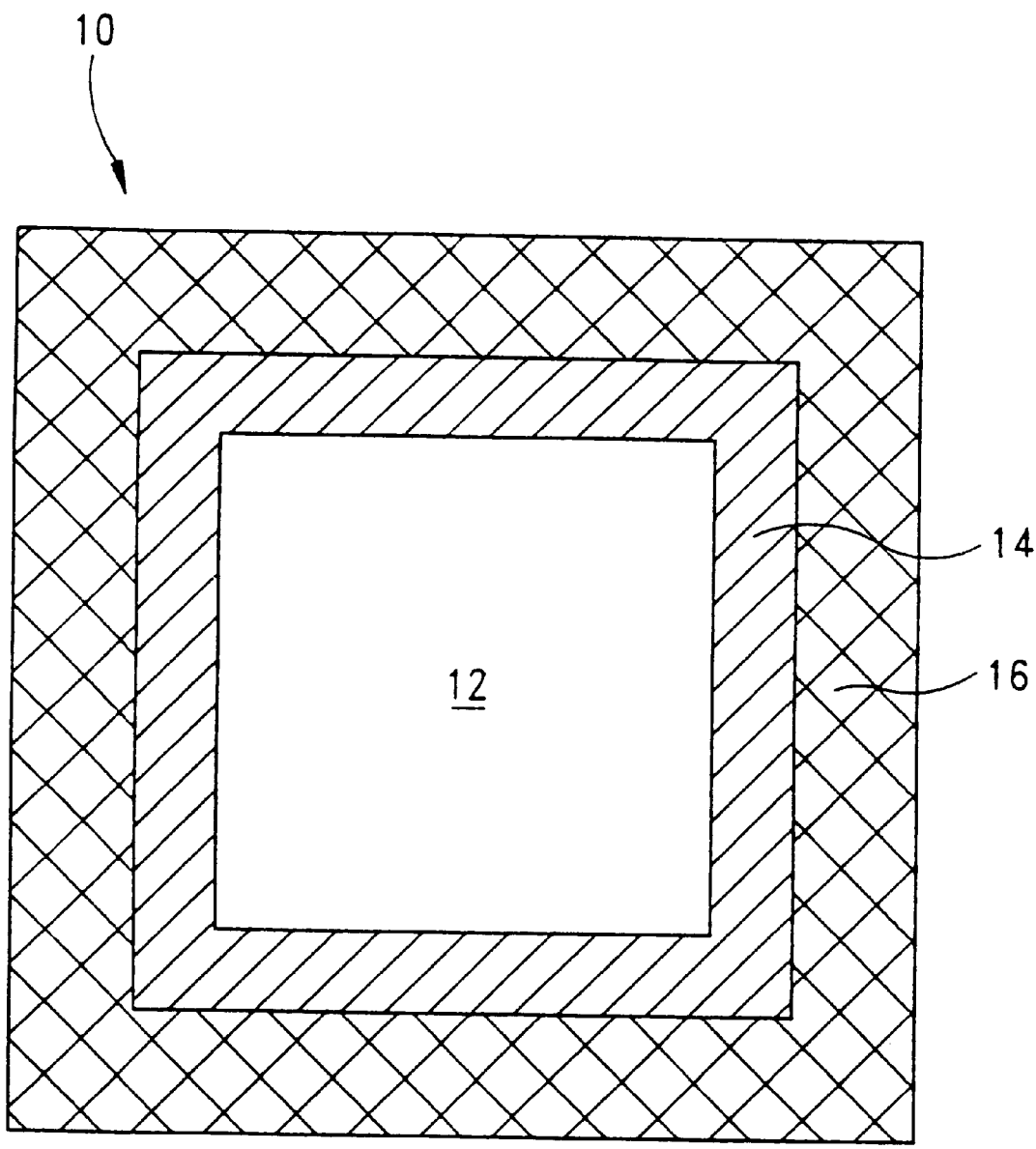
FIG. 1 illustrates a schematic figure of an integrated circuits array in the conventional device.
Figure 2:
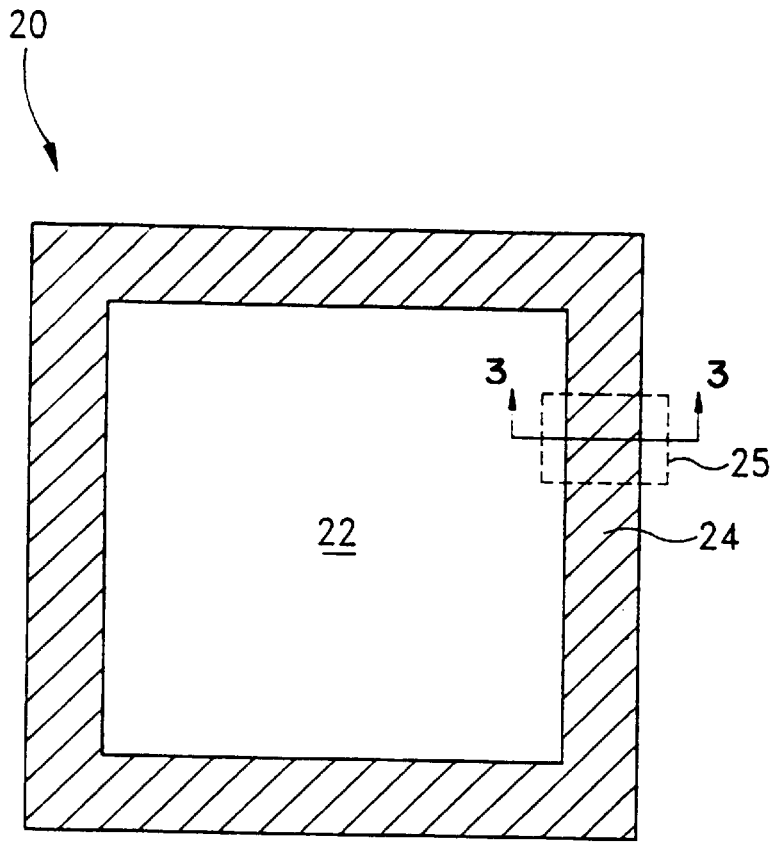
FIG. 2 illustrates a schematic figure of an integrated circuits array in the present invention.

Referring to FIG. 2, an integrated circuits array 20 with latch up protection is illustrated. The integrated circuits array 20 includes an active array 22 and a guard array 24 abutting an outer peripheral portion of the active array 22. The active array 22 are functional area of the integrated circuits. In general, the active array 22 includes a lot of integrated circuits devices with operational functionality to perform the operation of the circuits. For example, the active array 22 can be a memory array or more specifically a read only memory (ROM) array.

Figure 3:
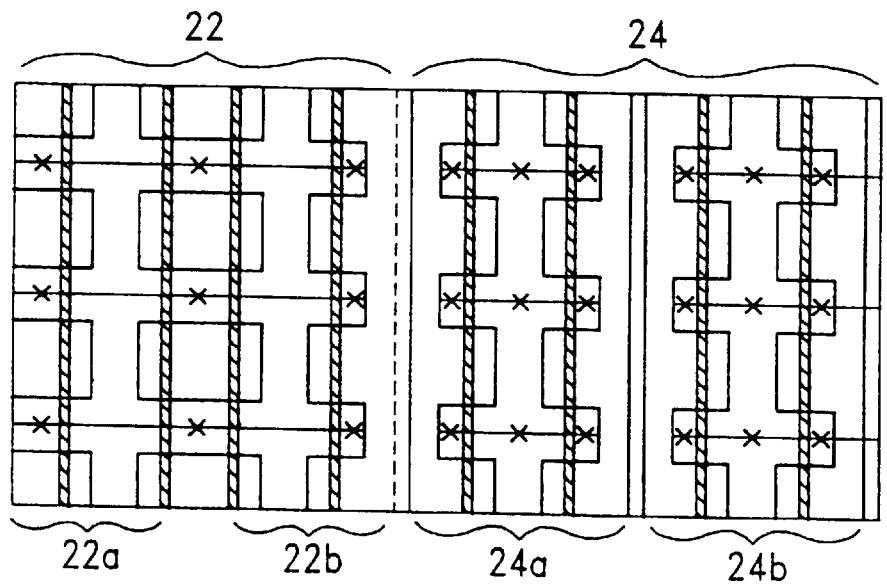
FIG. 3 illustrates an enlarged view of a portion of the active array and the guard array in the present invention.

The guard array 24 is employed for protecting the integrated circuits devices in the active array 22 from latch up. The guard array 24 contains a lot of transistors. Referring to FIG. 3, a portion 25 of the integrated circuits array 20 in FIG. 2 is illustrated in detail. Generally, the active array 22 contains numerous transistors and a portion the transistors are shown in the figure. As a preferred embodiment, the transistors of the guard array 24 can be formed simultaneously with the transistors in the active array 22. Transistors of the same structure or size can be formed in both the active array 22 and the guard array 24. Thus the transistors the guard array 24 can be the duplication of the transistors in the active array 22 and the efforts in forming the guard array 24 can be significantly reduced.

In the case, transistors like PMOS (P channel metal oxide semiconductor) transistors and NMOS (N channel metal oxide semiconductor) transistors can be used. In the case, one or more rows of PMOS transistors and one or more rows of NMOS transistors can be used to circulate around the active array. Referring to FIG. 3, one row of PMOS transistors 24a and one row of NMOS transistors 24b can be used. The row of NMOS transistors 24b can circulate outside the row of PMOS transistors 24a with an isolation region in-between. The row of PMOS transistors 24a circulate along the outside peripheral of the active array 22 also with an isolation region in-between.

Figure 4:
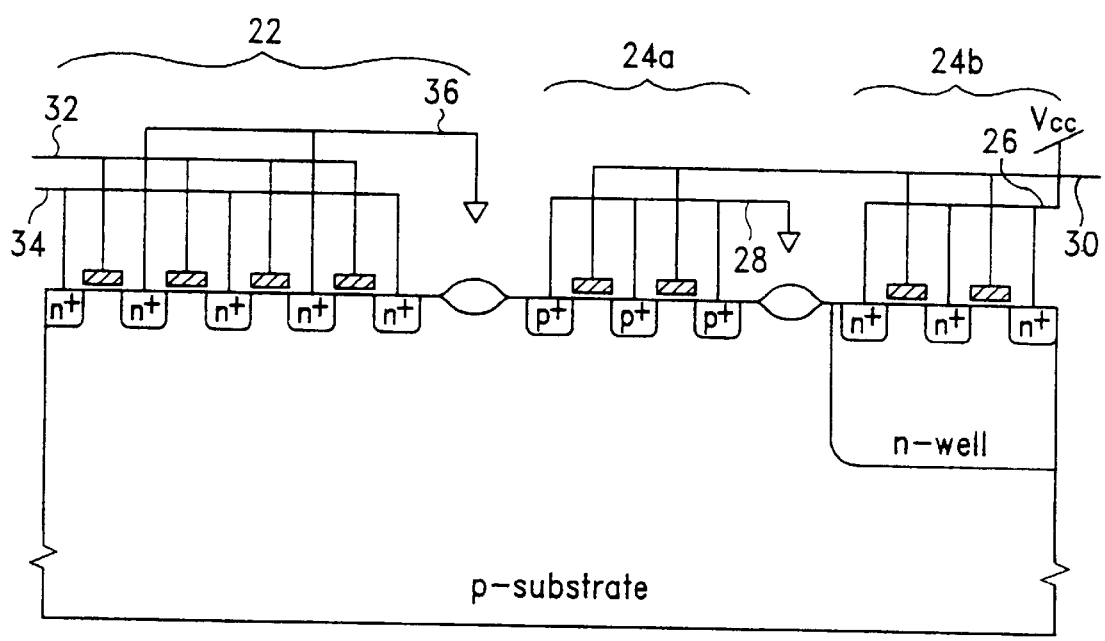
FIG. 4 illustrates a cross sectional view of a portion of the active array and the guard array in the present invention.

A cross sectional view of a portion of the active array 24 and the guard array 24 with line I—I as a reference in FIG. 2 is shown in FIG. 4. Two rows of PMOS transistors 24a and two row of NMOS transistors 24b are used here. For best guarding effects on latch up protection, the contacts 26 of the NMOS transistors 24b are connected to a power supply like a voltage source Vcc and the contacts 28 of the PMOS transistors 24a are connected to ground. Moreover, the gates 30 of the NMOS transistors 24b and the PMOS transistors 24a can be used as reference word line or connected directly to a power supply or ground.

As an example of a ROM array for the active array 22, the gates 32 is used as word lines of the memory. The metal contacts 34 is used as bitline and the ground is connected to the shared diffusion region 36. Other kinds circuits of active array 22 can also be used to be protected by the guard array 24, the numerous variations are not described in detail.

With the latch up protection and yield improvement device disclosed in the present invention, the guard array is employed to solve the non-uniformity and latch up problem. The area for non-functional device can be significantly reduced by the device.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An integrated circuits array with latch up protection, said integrated circuits array comprising:

an active array comprising a plurality of integrated circuits devices having operational functions; and a guard array abutting an outer peripheral portion of said active array, said guard array comprising a plurality of transistors for protecting said plurality of integrated circuits devices from latch up.

2. The integrated circuits array of claim 1, wherein said active array comprises a memory array.

3. The integrated circuits array of claim 1, wherein said active array comprises a read only memory (ROM) array.

4. The integrated circuits array of claim 1, wherein said plurality of transistors are formed simultaneously with transistors in said active array and have same structure with said transistors in said active array.

5. The integrated circuits array of claim 1, wherein said plurality of transistors comprise PMOS transistors and NMOS transistors.

6. The integrated circuits array of claim 1, wherein said plurality of transistors comprise at least one row of PMOS transistors and at least one row of NMOS transistors circulating around said active array.

7. The integrated circuits array of claim 6, wherein said at least one row of NMOS transistors circulate outside said at least one row of PMOS transistors with a first isolation region in-between and said at least one row of PMOS transistors circulate outside said active array with a second isolation region in-between.

8. The integrated circuits array of claim 6, wherein contacts of said at least one row of NMOS transistors are connected to a power supply and contacts of said at least one row of PMOS transistors are connected to ground.

9. The integrated circuits array of claim 6, wherein gates of said at least one row of NMOS transistors and of said at least one row of PMOS transistors are used as a reference word line for a memory array in said active array.

10. The integrated circuits array of claim 6, wherein gates of said at least one row of NMOS transistors and of said at least one row of PMOS transistors are connected to a power supply or ground.

11. An integrated circuits array with latch up protection, said integrated circuits array comprising:

an active array comprising a plurality of integrated circuits devices having operational functions, said active array comprising a read only memory (ROM) array; and a guard array abutting an outer peripheral portion of said active array, said guard array comprising a plurality of transistors for protecting said plurality of integrated circuits devices from latch up, said plurality of transistors comprising at least one row of PMOS transistors and at least one row of NMOS transistors circulating around said active array.

12. The integrated circuits array of claim 11, wherein said at least one row of NMOS transistors circulate outside said at least one row of PMOS transistors with a first isolation region in-between and said at least one row of PMOS transistors circulate outside said active array with a second isolation region in-between.

13. The integrated circuits array of claim 11, wherein contacts of said at least one row of NMOS transistors are connected to a power supply and contacts of said at least one row of PMOS transistors are connected to ground.

14. The integrated circuits array of claim 11, wherein gates of said at least one row of NMOS transistors and of said at least one row of PMOS transistors are used as a reference word line.

15. The integrated circuits array of claim 11, wherein gates of said at least one row of NMOS transistors and of said at least one row of PMOS transistors are connected to a power supply or ground.

* * * * *